(12) United States Patent
Büchel et al.

(10) Patent No.: US 12,283,469 B2
(45) Date of Patent: Apr. 22, 2025

(54) HIGH-FREQUENCY GROUNDING DEVICE AND VACUUM VALVE HAVING HIGH-FREQUENCY GROUNDING DEVICE

(71) Applicant: VAT Holding AG, Haag (CH)

(72) Inventors: Arthur Büchel, Ruggell (LI); Adrian Weitnauer, Näfels (CH)

(73) Assignee: VAT HOLDING AG, Haag (CH)

( * ) Notice: Subject to any disclaimer, the term of this patent is extended or adjusted under 35 U.S.C. 154(b) by 129 days.

(21) Appl. No.: 17/744,866

(22) Filed: May 16, 2022

(65) Prior Publication Data

US 2022/0375732 A1 Nov. 24, 2022

(30) Foreign Application Priority Data

May 18, 2021 (DE) .................... 10 2021 002 577.6

(51) Int. Cl.
*H01J 37/32* (2006.01)
*F16K 51/02* (2006.01)
*H05F 3/02* (2006.01)

(52) U.S. Cl.
CPC ........ *H01J 37/32816* (2013.01); *F16K 51/02* (2013.01); *H01J 37/32082* (2013.01); *H05F 3/02* (2013.01); *H01J 2237/186* (2013.01)

(58) Field of Classification Search
None
See application file for complete search history.

(56) References Cited

U.S. PATENT DOCUMENTS 6,056,266 A * 5/2000 Blecha .................. F16K 3/0218
251/193
6,089,537 A * 7/2000 Olmsted ................. F16K 51/02
251/298

(Continued)

FOREIGN PATENT DOCUMENTS

DE 20 2017 000 412 U1 3/2017
DE 102021000787 A1 8/2022
WO WO-2020/222764 A1 11/2020

OTHER PUBLICATIONS

"German Search Report and Written Opinion: Recherchebereicht," German Application No. 10 2021 002 577.6, Date of Mailing: Feb. 28, 2022, pp. 1-12.

*Primary Examiner* — Srinivas Sathiraju
(74) *Attorney, Agent, or Firm* — Muncy, Geissler, Olds & Lowe, P.C.

(57) ABSTRACT

The invention relates to a high-frequency grounding device (40) for use with a vacuum valve for closing and opening a valve opening of a vacuum chamber system, having a grounding band (42) made of a conductive material for discharging electrical charges occurring on the vacuum valve, wherein the grounding band has a first end (41) and a second end (43) and, for grounding the vacuum valve, is designed to be connected at the first end to a valve closure of the vacuum valve, and to be connected at the second end to a component of the vacuum chamber system, wherein the high-frequency grounding device has a correction impedance, wherein the grounding band is coupled to the correction impedance so that a resonant circuit results, which comprises the grounding band and the correction impedance, and the correction impedance has a first element for shifting a resonant frequency of the resonant circuit and/or a second element for reducing a quality of the resonant circuit. The invention additionally relates to a vacuum valve (Continued)

and a vacuum chamber system having such a high-frequency grounding device.

20 Claims, 6 Drawing Sheets

(56) References Cited

U.S. PATENT DOCUMENTS

| | | | |
|---|---|---|---|
| 6,416,037 B1* | 7/2002 | Geiser | F16K 3/188 |
| | | | 277/634 |
| 6,629,682 B2* | 10/2003 | Duelli | F16K 51/02 |
| | | | 251/328 |
| 2019/0331257 A1* | 10/2019 | Nagai | H01L 21/67126 |
| 2020/0049278 A1* | 2/2020 | Hosek | F16K 31/0693 |
| 2020/0056722 A1* | 2/2020 | Eschenmoser | F16K 3/10 |
| 2020/0132222 A1* | 4/2020 | Eschenmoser | F16K 3/04 |
| 2020/0166154 A1* | 5/2020 | Eschenmoser | F16K 3/18 |
| 2020/0182375 A1* | 6/2020 | Böhm | F16K 3/18 |
| 2020/0224790 A1* | 7/2020 | Eschenmoser | F16K 3/18 |
| 2021/0020404 A1* | 1/2021 | Savas | H01L 21/31111 |
| 2022/0375732 A1* | 11/2022 | Büchel | H01L 21/67126 |
| 2024/0229967 A9 | 7/2024 | Hofer et al. | |

* cited by examiner

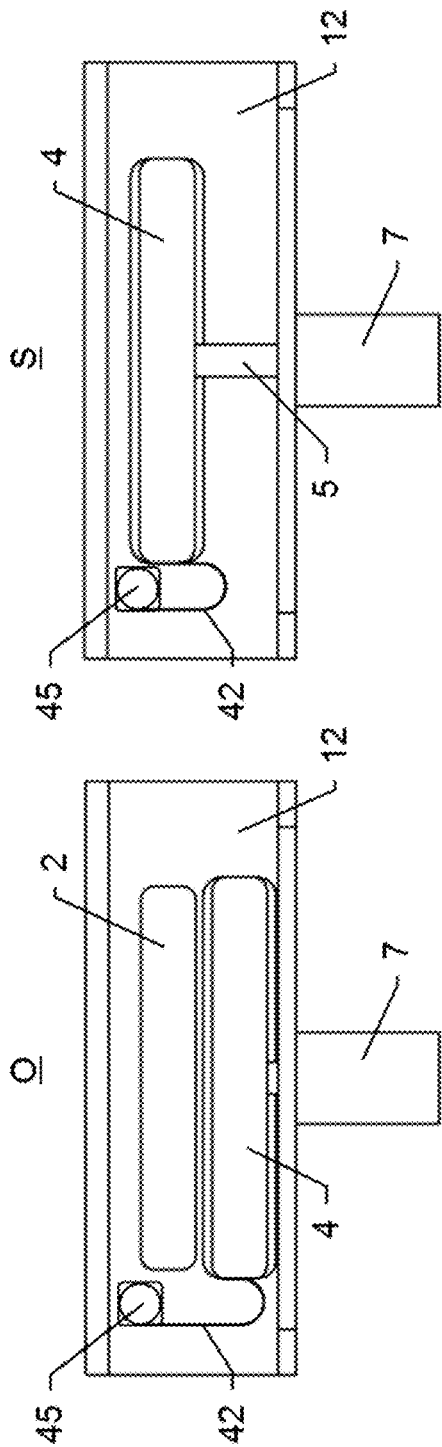

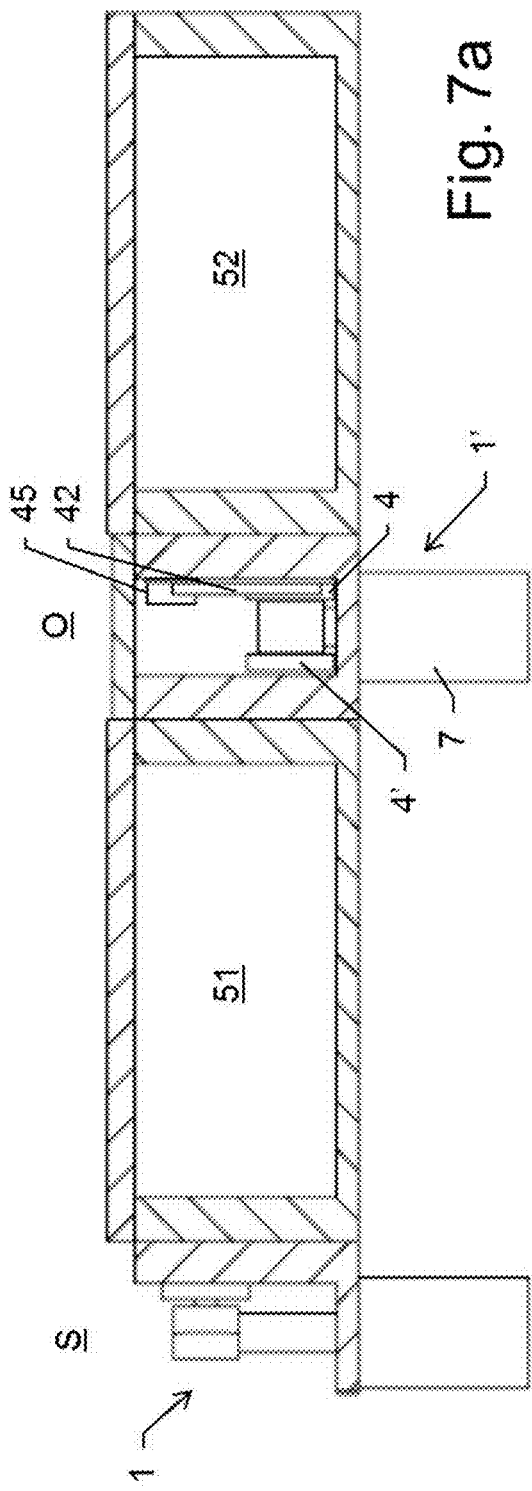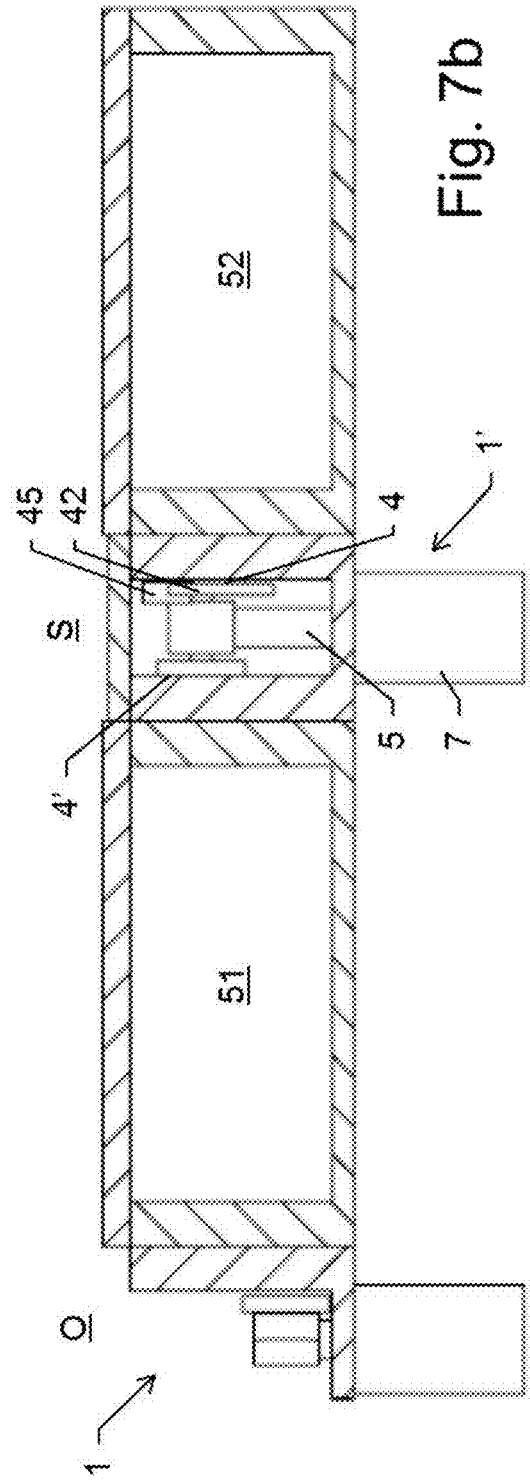

HIGH-FREQUENCY GROUNDING DEVICE AND VACUUM VALVE HAVING HIGH-FREQUENCY GROUNDING DEVICE

CROSS-REFERENCE TO RELATED APPLICATIONS

The present application claims priority from German patent application No. 10 2021 002 577.6 filed on May 18, 2021, the disclosure of which should be understood to be incorporated into this specification.

FIELD OF DISCLOSURE

The invention relates to an improved high-frequency grounding device for a vacuum valve of the vacuum chamber system for avoiding undesired plasma discharges in the vacuum chamber system. The invention additionally relates to a vacuum valve, in particular a transfer vacuum valve having such a high-frequency grounding device, and a vacuum chamber system having such a vacuum valve.

BACKGROUND

In general, valves are provided to make a flow, in particular of a fluid, settable. Using a valve, the flow can be permitted over a maximum valve opening cross section or completely shut off. Moreover, certain valve types permit the possibility of regulating a flow rate per unit of time, thus provide an ability to regulate a fluid flow.

Vacuum valves form a specific type of valve. These are used for regulating a volume or mass flow and/or for essentially gas-tight closing of a flow path leading through an opening formed in a valve housing, are generally known from the prior art in various embodiments, and are used in particular in vacuum chamber systems in the area of IC, semiconductor or substrate production, which has to take place in a protected atmosphere as far as possible without the presence of contaminating particles.

Such vacuum chamber systems comprise in particular at least one evacuatable vacuum chamber which is provided for receiving semiconductor elements or substrates to be processed or produced and which has at least one vacuum chamber opening through which the semiconductor elements or other substrates can be guided into and out of the vacuum chamber, and at least one vacuum pump for evacuating the vacuum chamber. For example, in a production plant for semiconductor wafers or liquid crystal substrates, the highly sensitive semiconductor or liquid crystal elements pass sequentially through multiple process vacuum chambers in which the parts located within the process vacuum chambers are each processed by means of a processing device. Both during the machining process within the process vacuum chambers and during the transport from chamber to chamber, the highly sensitive semiconductor elements or substrates always has to be located in a protected atmosphere—especially in an airless environment.

For this purpose, peripheral valves are used to open and close a gas inlet or outlet and transfer valves are used to open and close the transfer openings of the vacuum chambers for inserting and removing the parts.

The vacuum valves through which semiconductor parts pass are referred to as vacuum transfer valves due to the area of application described and the associated dimensioning, as rectangular valves due to their mainly rectangular opening cross section, and also as slide valves, rectangular sliders, or transfer slide valves due to their normal mode of operation.

Peripheral valves are used in particular to control or regulate the gas flow between a vacuum chamber and a vacuum pump or another vacuum chamber. For example, peripheral valves are located within a pipe system between a process vacuum chamber or a transfer chamber and a vacuum pump, the atmosphere, or another process vacuum chamber. The opening cross section of such valves, also known as pump valves, is generally smaller than that of a vacuum transfer valve. Peripheral valves are also called control valves because, depending on the application, they are not only used to completely open and close an opening, but also to control or regulate a flow by continuously adjusting the opening cross section between a completely open position and a gas-tight closed position. A possible peripheral valve for controlling or regulating the gas flow is the pendulum valve.

In a typical pendulum valve, as known from U.S. Pat. No. 6,089,537 (Olmsted), for example, the first step is to rotate a normally round valve plate from a position that releases the opening to an intermediate position that covers the opening over an opening that is usually also round. In the case of a slide valve, as described for example in U.S. Pat. No. 6,416,037 (Geiser) or U.S. Pat. No. 6,056,266 (Blecha), the valve plate, as well as the opening, is usually rectangular and in this first step is pushed linearly from a position releasing the opening into an intermediate position covering the opening. In this intermediate position, the valve plate of the pendulum or slide valve is located opposing at a distance from the valve seat surrounding the opening. In a second step, the distance between the valve plate and the valve seat is reduced so that the valve plate and the valve seat are pressed evenly against each other and the opening is closed essentially gas-tight. This second movement preferably occurs in a direction substantially perpendicular to the valve seat.

The sealing can either take place via a sealing ring arranged on the closure side of the valve plate, which is pressed onto the valve seat circumferential around the opening, or via a sealing ring on the valve seat, against which the closure side of the valve plate is pressed. Due to the closing procedure occurring in two steps, the sealing ring between the valve plate and the valve seat is hardly subjected to shear forces, which would destroy the sealing ring, since the movement of the valve plate in the second step takes place essentially linearly perpendicularly onto the valve seat.

Various prior art sealing devices are known, for example from the U.S. Pat. No. 6,629,682 B2 (Duelli). A suitable material for sealing rings and seals in vacuum valves is, for example, fluororubber, also known as FKM, in particular the fluoroelastomer known under the trade name "Viton", and perfluororubber, FFKM for short.

From the prior art, different drive systems are known to achieve this combination of a rotational movement in the pendulum valve and a translational movement in the slide valve of the valve plate parallel over the opening and a substantially translational movement perpendicular to the opening, for example from U.S. Pat. No. 6,089,537 (Olmsted) for a pendulum valve and from U.S. Pat. No. 6,416,037 (Geiser) for a slide valve.

The described multistep movement, during which the closure element first has to be pushed transversely over the opening without a contact of the seal with the valve seat occurring, and the closure element is subsequently pressed essentially perpendicularly onto the valve seat, in addition to the advantage that the seal is compressed nearly exclusively perpendicularly, without a transverse or longitudinal stress of the seal occurring (particle avoidance), also offers the option of regulating the flow of the medium (for example process gas) through the valve opening.

Such vacuum valves are required, inter alia, for those vacuum chambers which are designed for the technical application of low-pressure plasmas. A low-pressure plasma is a plasma in which the pressure is significantly lower than the Earth's atmospheric pressure. Typical technical low-pressure plasmas are operated in the pressure range of a few pascals, thus at pressures which are less by a factor of 10,000 than normal air pressure. They are important means in the production of microelectronic components, for example by plasma etching or sputtering, or the finishing of surfaces. Thus, for example, in the plasma etching of PTFE, material is removed from the surface by means of a hydrogen plasma. The treatment takes place under a specific pressure in a vacuum chamber, where electrical excitation of hydrogen gas occurs.

In the use of vacuum valves in conjunction with low-pressure plasmas, it is necessary that the valve shields the electromagnetic field well in the interior of the process chamber, without becoming electrically charged. For this purpose, for example, the potential differences between the individual components of the valve or between the valve and the other components of the vacuum chamber system can be equalized by means of grounding bands. Due to the use of such grounding bands, it can in addition advantageously occur that parasitic resonant circuits having resonance frequencies in the range of the excitation frequency of the plasma occur, so that undesired plasma discharges ("parasitic discharges") can occur. The problem of parasitic discharges increases with increasing power during the electrical excitation.

SUMMARY

The following presents a simplified summary relating to one or more aspects and/or The invention is thus based on the object of providing an improved vacuum valve and an improved grounding system which reduce or avoid the above-mentioned disadvantages.

A further object of the invention is to provide such a vacuum valve and such a grounding system which are suitable for applications in which low-pressure plasmas are used.

A further object of the invention is also to provide an improved vacuum chamber system which has such a vacuum valve and such a grounding system.

These objects are achieved by the implementation of the characterizing features of the independent claims. Features which refine the invention in an alternative or advantageous manner can be inferred from the dependent claims.

The first aspect of the invention relates to a high-frequency grounding device for use with a vacuum valve for closing and opening a valve opening of a vacuum chamber system. The high-frequency grounding device has a grounding band made of a conductive material for discharging electrical charges occurring at the vacuum valve, wherein the grounding band has a first end and a second end and, for grounding the vacuum valve, is designed for the purpose of being connected at the first end to a valve closure of the vacuum valve and being connected at the second end to a component, in particular a housing or a wall, of the vacuum chamber system.

According to the invention, the high-frequency grounding device has a correction impedance, wherein the grounding band is coupled to the correction impedance so that a resonant circuit results, which comprises at least the grounding band and the correction impedance. The correction impedance has a first element for shifting a resonance frequency of the resonant circuit and/or a second element for reducing a quality of the resonant circuit.

The resonant circuit can in particular have a definable resonance frequency and/or a definable quality. The resonant circuit is formed in particular by the correction impedance, the grounding band, and parts of the valve, in particular by parasitic impedances of the vacuum valve or the valve closure.

The vacuum chamber system can have a process chamber in which a low-pressure plasma can be generated by excitation at an excitation frequency. The low-pressure plasma can be generated in particular by means of shortwave excitation, and the excitation frequency of the low-pressure plasma can be, for example, 13.56 MHz.

In this case, the correction impedance can have a first element, which is designed to distance a resonance frequency of the resonant circuit from the excitation frequency of the low-pressure plasma, in particular in such a way that the resonance frequency is at least 20% less than the excitation frequency.

In one embodiment, the first element can be designed in such a way that the resonant circuit has a resonance frequency which is less than half of the excitation frequency of the low-pressure plasma, in particular less than one-fourth of the excitation frequency.

The vacuum chamber system can also have an airlock chamber upstream of the process chamber, wherein the airlock chamber and an environment of the vacuum chamber system are connected to one another by a first vacuum valve, and the process chamber and the airlock chamber are connected to one another by a second vacuum valve.

In one embodiment, the high-frequency grounding device is designed for use with the second vacuum valve, wherein the valve opening is an opening between the process chamber and the airlock chamber.

According to one embodiment of the high-frequency grounding device, the correction impedance has at least the second element, wherein this second element, for reducing the quality of the resonant circuit has an electrical resistance, which is at least 1Ω (ohm), for example between 1 and 100Ω. The electrical resistance of the second element is preferably significantly higher than that of the grounding band, for example, more than twice as high.

According to one embodiment, the second element is designed in such a way that a quality factor Q of the resonant circuit is less than 0.5, in particular less than 0.25. The electrical resistance for the respective resonant circuit is to be selected appropriately for this purpose, i.e., in particular sufficiently large.

According to a further embodiment of the high-frequency grounding device, the correction impedance at least has the first element, wherein this element, for shifting the resonance frequency, has an inductance of 1 to 100 µH (microhenry), for example, an inductance between 10 and 40 µH. The shift of the resonance frequency can in particular be a decrease here.

According to a further embodiment of the high-frequency grounding device, the correction impedance has as the first element a coil, wherein the coil has a body and a metal wire wound around the body, wherein the body is cylindrical, for example.

In one embodiment, the body of the coil consists entirely or partially of polyether ether ketone (PEEK). In particular, the proportion of PEEK is at least 25%. PEEK has proven to be particularly suitable as a coil body material for use in high vacuum.

In one embodiment, the coil has between 12 and 25 turns of the metal wire around the body, for example 22 turns. In one embodiment, the metal wire has a diameter of approximately 0.6 mm.

In one embodiment, the metal wire is a steel wire, in particular made of rustproof steel. This has proven to be particularly suitable for use in high vacuum.

According to a further embodiment of the high-frequency grounding device, the grounding band is a metal band, in particular a steel band made of stainless steel, and has a length between the first end and the second end of at least 50 cm. Such a steel band can in particular have an electrical resistance of less than 1Ω.

A second aspect of the invention relates to a vacuum valve—for example designed as a vacuum transfer valve—for closing and opening a valve opening of the vacuum chamber system. The vacuum valve comprises a valve seat, which has the valve opening defining an opening axis and a first sealing surface circumferentially around the valve opening, a valve closure (valve plate) for regulating the volume or mass flow and/or for closing the valve opening essentially gas-tight using a second sealing surface corresponding to the first sealing surface, and a grounding device having a grounding band for discharging occurring electrical charges.

According to this aspect of the invention, the grounding device is designed as a high-frequency grounding device according to the first aspect of the invention. That is to say, the high-frequency grounding device has a grounding band made of a conductive material for discharging electrical charges occurring at the vacuum valve, wherein the grounding band has a first end and a second end and, for grounding the vacuum valve, is designed to be connected at the first end to the valve closure, and to be connected at the second end to a component of the vacuum chamber system. In addition, the high-frequency grounding device has a correction impedance, wherein the grounding band is coupled to the correction impedance so that a resonant circuit results, which comprises at least the grounding band and the correction impedance. The correction impedance has a first element for shifting a resonance frequency of the resonant circuit and/or a second element for decreasing a quality of the resonant circuit.

In one embodiment, the vacuum valve has precisely one such high-frequency grounding device having precisely one grounding band and precisely one coil as the first element of the correction impedance.

In a further embodiment, the vacuum valve has a drive unit coupled to the valve closure, which is configured to provide a movement of the valve closure in such a way that the valve closure is adjustable from an open position, in which the valve closure at least partially releases the valve opening, into a closed position, in which a sealing contact of the first sealing surface and the second sealing surface with a sealing material provided in between exists and the valve opening is thus closed gas-tight, and back.

In one embodiment, the vacuum valve has a bellows, which is connected to the valve closure and to the valve housing for the atmospheric separation of the drive unit from a process volume, wherein the bellows is designed and arranged in such a way that it is compressed in the open position and expanded in the closed position.

A third aspect of the invention relates to a vacuum chamber system having a process chamber, in which a low-pressure plasma can be generated, and an airlock chamber upstream from the process chamber. According to this aspect of the invention, the vacuum chamber system has at least one vacuum valve according to the second aspect of the invention having a high-frequency grounding device according to the first aspect of the invention.

In one embodiment, a low-pressure plasma can be generated in the process chamber by excitation at an excitation frequency. The low-pressure plasma can be generated in particular by means of shortwave excitation here, and the excitation frequency of the low-pressure plasma can be, for example, 13.56 MHz.

In one embodiment, the airlock chamber and an environment of the vacuum chamber system are connected to one another by a first vacuum valve, and the process chamber and the airlock chamber are connected to one another by a second vacuum valve. In particular, the second vacuum valve can then be designed as a vacuum valve according to the second aspect of the invention.

BRIEF DESCRIPTION OF THE DRAWINGS

The high-frequency grounding device according to the invention, the vacuum valve according to the invention, and the vacuum chamber system according to the invention are described in more detail hereinafter solely by way of example on the basis of exemplary embodiments schematically shown in the drawings. The described embodiments are not necessarily shown to scale and they are also not to be understood as a restriction. In the specific figures:

FIGS. 6a-b show the high-frequency grounding device of FIG. 5 on an exemplary embodiment of a vacuum valve according to the invention; and FIGS. 7a-b show a further exemplary embodiment of a vacuum chamber system according to the invention having a vacuum valve and a high-frequency grounding device.

DETAILED DESCRIPTION

Figure 1:
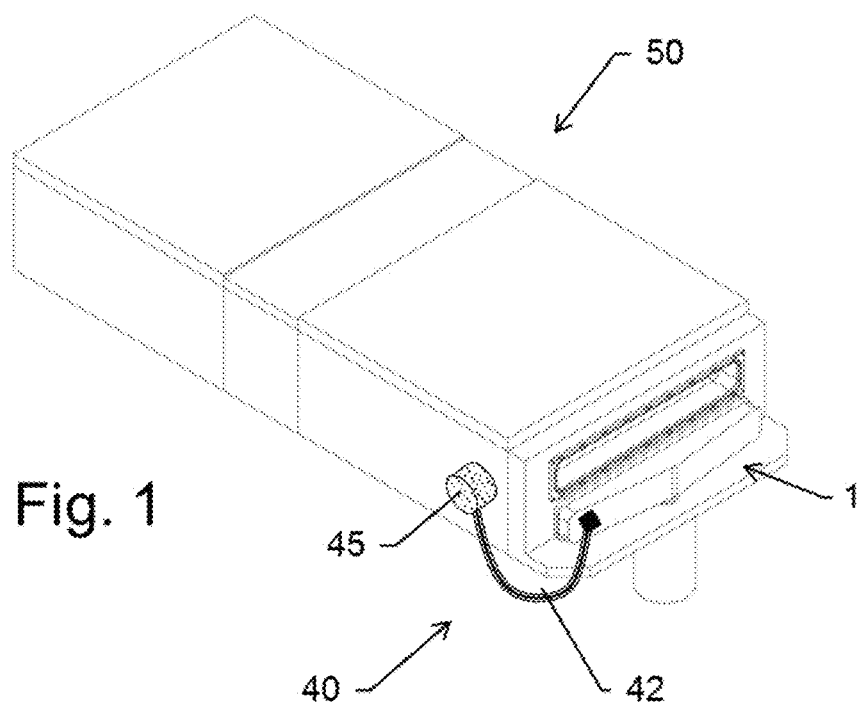
FIG. 1 shows an exemplary embodiment of a vacuum chamber system according to the invention having a vacuum valve and a high-frequency grounding device.

FIG. 1 shows an exemplary embodiment of a vacuum chamber system 50 for the technical application of low-pressure plasmas. The vacuum chamber system 50 has a vacuum valve 1 having a high-frequency grounding device 40 according to the invention.

The vacuum valve 1 is to shield the electromagnetic field in the interior of the process chamber well without becoming electrically charged. For this purpose, potential differences between the vacuum valve 1 (or its closure, the so-called valve plate) and an outer wall of the vacuum chamber system 50 are equalized here by means of the grounding band 42. In particular, a jacket wave can also be discharged by the high-frequency grounding device 40.

According to the invention, a correction impedance is provided, which prevents the grounding device from forming a parallel resonant circuit, the resonance frequency of which is in a problematic range. The correction impedance can have, for example, a coil 45, using which the frequency of the resonant circuit is detuned. Alternatively or additionally, the correction impedance can have an electrical resistor, which reduces the quality of the parasitic resonant circuit enough that the impedance always remains restricted. The precise design of the correction impedance is dependent on the specifications of the vacuum valve 1, and the frequency to be kept free, i.e., in particular a process frequency in the vacuum chamber system 50.

Figure 2:
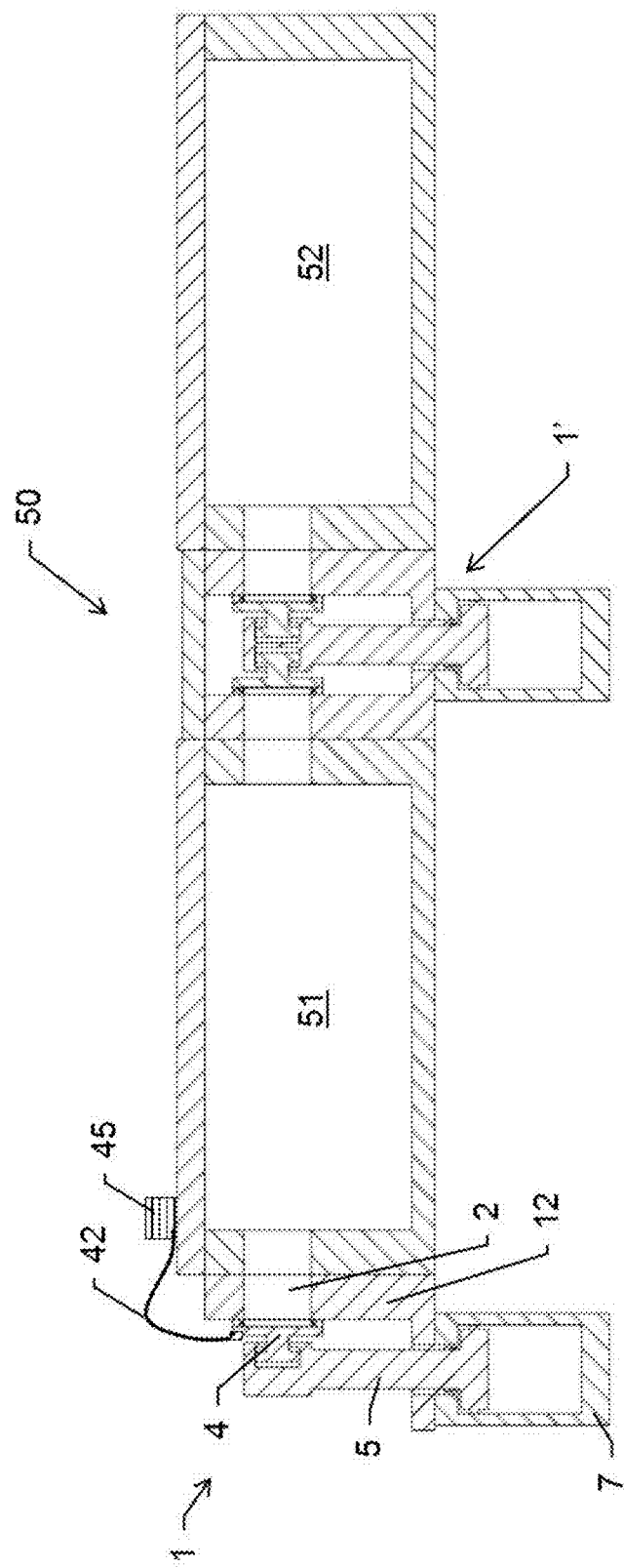
FIG. 2 shows the vacuum chamber system of FIG. 1 in cross section.

In FIG. 2, this vacuum chamber system 50 is shown in a cross section. The vacuum chamber system 50 has a process chamber 52, in which low-pressure plasmas can be generated and used for various technical applications. An airlock chamber 51 is connected upstream from this process chamber 52. In the embodiment shown, a first vacuum valve 1 is provided between the airlock chamber 51 and the external atmosphere, which opens or close the valve opening 2 as needed by means of a valve closure 4 (valve plate). A second valve element 1' is provided between the airlock chamber 51 and the process chamber 52. This structure enables the pressure inside the process chamber 52 to be kept low in an unchanged manner during a long time period. One or both of these vacuum valves 1, 1' can be embodied having a high-frequency grounding device 40 according to the invention.

In the embodiment shown here, only the first vacuum valve 1 is embodied having a high-frequency grounding device according to the invention. The valve closure 4 is arranged on an adjustment arm 5, which is mechanically coupled to a drive unit 7. A grounding band 42 of the high-frequency grounding device connects the valve closure 4 to the housing of the vacuum chamber system 50 to ground the vacuum valve 1. The grounding band 42 is coupled there to a correction impedance, embodied here as a coil 45, of the grounding device. The correction impedance is designed according to the invention in such a way that it has a resistance and a reactance, which ensure that a resonance frequency of the parasitic resonant circuit formed by the high-frequency grounding device differs sufficiently from the excitation frequency of the low-pressure plasma.

If a resonance frequency of the grounding band 42 without coil 45 (or other correction impedance) is, for example, approximately 15 MHz, in case of a shortwave excitation of the plasma at 13.56 MHz, this can result in undesired plasma discharges. Due to the addition of a correction impedance like the coil 45, in this way the resonance frequency can be shifted into a harmless range, in particular to a frequency which is less than half of the excitation frequency.

Figure 3C:
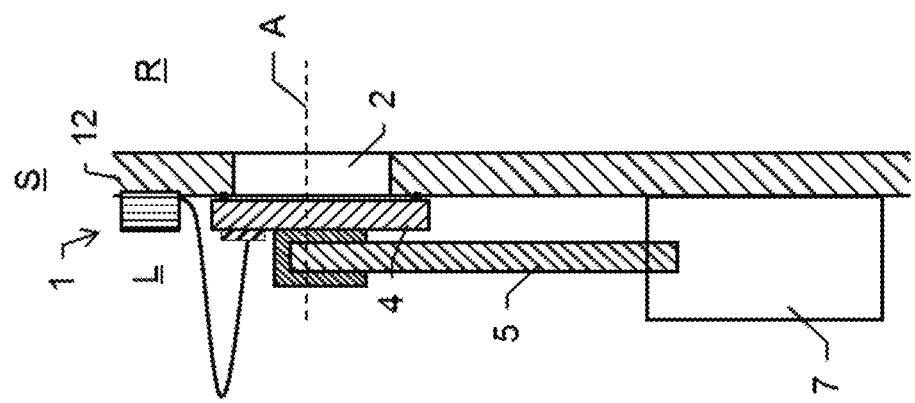
FIGS. 3a-c show an exemplary embodiment of the vacuum valve according to the invention having a high-frequency grounding device.
Figure 3B:
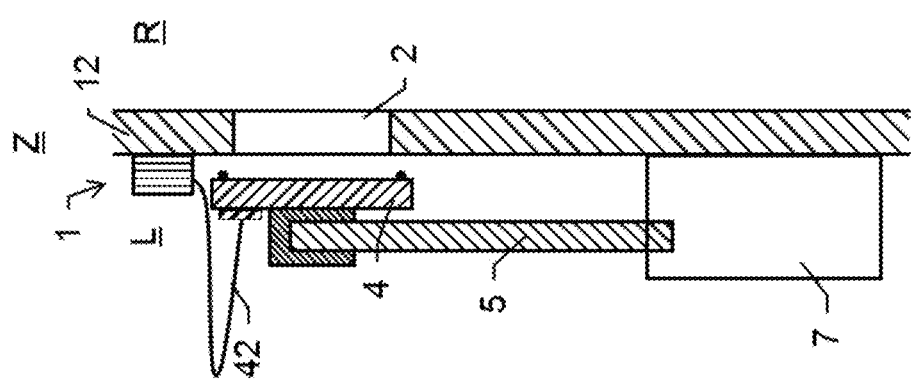
Figure 3A:
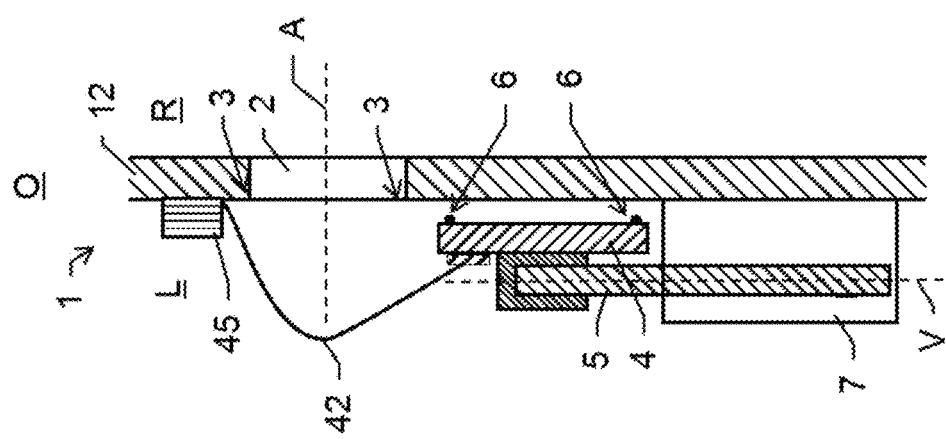

FIGS. 3a to 3c show an embodiment of a vacuum valve 1 according to the invention, which is designed as a vacuum transfer valve, shown in different closure positions (0, Z, S). The vacuum valve 1 shown has a rectangular, plate-shaped valve closure 4 (valve plate), which has a sealing surface 6 (second sealing surface) for the gas-tight closing of an opening 2. The opening 2 has a cross section corresponding to the valve closure 4 and is formed in a wall 12. The wall 12 can be, for example, a wall of the vacuum chamber system shown in FIGS. 1 and 2. The opening 2 is enclosed by a valve seat, which in turn also provides a sealing surface 3 (first sealing surface) corresponding to the sealing surface 6 of the valve closure 4. The sealing surface 6 of the valve closure 4 extends around the valve closure 4 and has a sealing material (seal). In a closed position S (FIG. 3c), the seal is compressed between the sealing surfaces 6 and 3.

The opening 2 connects a first gas region L, which is located to the left of the wall 12, to a second gas region R to the right of the wall 12. The wall 12 is formed, for example, by a chamber wall of a vacuum chamber system, or the airlock chamber (cf. FIG. 2). The vacuum valve 1 is then formed by an interaction of the chamber wall 12 with the valve closure 4. The first gas region can in particular have atmospheric pressure here, while the second gas region in the interior of the vacuum chamber system, or in the airlock chamber, can have lower pressures when the vacuum valve is closed, in particular a vacuum.

It is obvious that the valve seat together with the first sealing surface 3 can alternatively be designed as a valve component structurally fixedly connected to the valve 1 and can be arranged, for example, screwed onto a chamber opening.

The valve closure 4 can be arranged, as shown here, on an adjustment arm 5, which is rod-shaped here, for example, and extends along a geometrical adjustment axis V. The adjustment arm 5 is mechanically coupled to a drive unit 7, by means of which the closure element 4 is adjustable in the first gas region L to the left of the wall 12 by adjusting the adjustment arm 5 by means of the drive unit 7 between an open position O (FIG. 3a) via an intermediate position Z (FIG. 3b) into a closed position S (FIG. 3c).

In the open position, the valve closure 4 is located outside a projection region of the opening 2 and releases it completely, as shown in FIG. 3a.

The valve closure 4 can be adjusted by means of the drive unit 7 from the open position O into the intermediate position Z by the linear adjustment of the valve closure 4 in the axial direction in a plane parallel to or coaxial with the adjustment axis V and parallel to the wall 12.

In this intermediate position Z (FIG. 3b), the sealing surface 6 of the valve closure 4 is located spaced apart in opposition to the sealing surface 3 of the valve seat enclosing the opening 2.

By adjustment in the direction of the opening axis A defined by the opening 2 (here: transversely to the adjustment axis V), thus, for example, perpendicularly to the wall 12 and to the valve seat, the valve closure 4 can be adjusted from the intermediate position Z into the closed position S (FIG. 3c).

In the closed position S, the valve plate 4 closes the opening 2 gas-tight and separates the first gas region L from the second gas region R, for example, in the interior of the airlock chamber of the vacuum chamber system, in a gas-tight manner. The open and closing of the vacuum valve takes place by means of the drive unit 7, here by an L-shaped movement in two directions H and A perpendicular to one another, for example, of the valve closure 4. The valve shown is therefore also called an L-type valve.

Instead of the embodiment of the vacuum valve shown solely by way of example in FIGS. 3a to 3c, a vacuum valve according to the invention can also be embodied in another way, for example, as a pendulum valve or monovalve, as described in detail, for example, in DE 10 2021 000 787.5. In particular, the vacuum valve can moreover have a bellows, which is connected on one side to the valve closure and on the other side to the valve housing. In this way, an atmospheric separation of a drive unit and an adjustment arm of the valve from a process volume can be provided. In the open valve state, the bellows is compressed and when the valve is closed it is extended.

According to the invention, the vacuum valve 1 has a high-frequency grounding device having a grounding band 42 and a correction impedance, wherein the correction impedance is designed here as a coil 45. A first end of the grounding band 42 is fastened on the valve closure 4 and is moved together with it during an opening or closing procedure. The second end of the grounding band 42 is fastened together with the coil 45 on the wall 12 (or at another point of the housing of the vacuum chamber system), so that a potential equalization of the valve plate 4 with the valve housing takes place (grounding). The distance between valve closure 4 and coil 45 varies in accordance with the adjustability of the valve plate 4, so that the length of the grounding band is to be selected accordingly.

In a vacuum valve 1, as shown in FIGS. 3*a-c*, a capacitor XC results due to the small distance present in the closed position S between valve closure 4 and wall 12, wherein the non-charging seal 6 acts as a dielectric material. Without influencing the functionality of the vacuum valve, the capacitance C of this capacitor XC can only be changed slightly.

Figure 4:
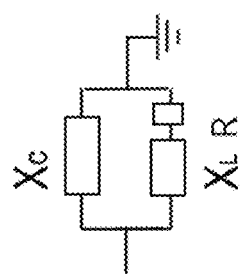
FIG. 4 shows a resonant circuit formed by an exemplary high-frequency grounding device.

FIG. 4 schematically shows the structure of a resonant circuit, as is formed by the components of the high-frequency grounding system, when they form a connection between vacuum valve and housing of the vacuum chamber for grounding. In this case, XC stands for a capacitor having a capacitance C, XL stands for a coil (or a similar element) having an inductance L, and R stands for an electrical resistance.

The resonance frequency of this resonant circuit is dependent on L and C and can therefore be influenced by changing L or C, while the quality Q of the resonant circuit is dependent on L and C and the resistance R. Since C cannot be influenced to a sufficient extent, the resonant circuit is tuned to a specific frequency according to the invention by an appropriately designed correction impedance. The inductance L and the resistance R can be set appropriately, for example, by a suitable structural expenditure of the coil 45 or other elements.

As known to a person skilled in the art, a correction impedance can also be formed in other ways instead of by a coil 45. A circuit made of electrical components comes into consideration here in particular, for example, having a throttle and a resistor in a common component.

Figure 5:
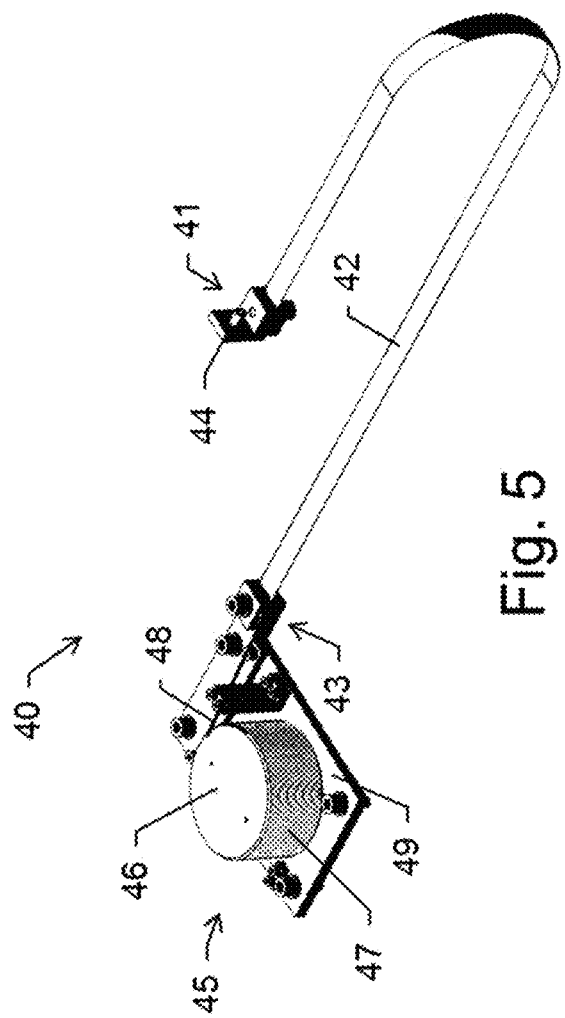
FIG. 5 shows an exemplary embodiment of a high-frequency grounding device according to the invention.

In FIG. 5, the high-frequency grounding system 40 is shown detached from the vacuum valve and in detail. Such a high-frequency grounding system 40 is preferably suitable for applications in high vacuum with respect to the materials and components used. In particular, none of the materials used is to outgas in vacuum.

The grounding system 40 shown has a grounding band 42 made of rustproof stainless steel and a correction impedance in the form of a coil 45. The grounding band 42 can have, for example, a length of approximately half a meter to one meter.

The electrical resistance of such a grounding band 42 made of stainless steel is comparatively low, for example, significantly less than 1Ω (ohm). At a first end 41 of the grounding band 42, it is electrically conductively connected by means of a terminal to a first connecting part 44 to be attached to the vacuum valve, in particular to the valve plate. At a second end 43 of the grounding band, it is electrically conductively connected to the coil 45. The coil 45 has a body 46, around which an insulated metal wire 47 is wound, for example made of the same material as the grounding band 42. One end 48 of the wire is connected to the second end 43 of the grounding band 42.

The coil 45 as a correction impedance is designed in such a way that the resonant circuit has a resonance frequency which differs significantly from an excitation frequency of a low-pressure plasma generated in the vacuum chamber system, in particular is significantly lower than the excitation frequency. For most applications, a shift of the excitation frequency into a lower frequency range is to be preferred over a shift into a higher frequency range, since harmonics can be avoided in this way. For example, the resonance frequency generated by the correction impedance can be less than half of the excitation frequency. A typical excitation frequency for low-pressure plasma is 13.56 MHz. In this case, the resonance frequency reduced by the coil 45 is to be less than 10 MHz, preferably less than 5 MHz, to reduce or preclude the risk of parasitic discharges.

For this purpose, for this case the coil 45 is to be designed in such a way that its inductance is between 1 pH and 100 pH (microhenry), appropriate to shift the resonance frequency of the respective vacuum valve at the desired point. The inductance and also the parasitic resistance of the coil 45 can be influenced, for example, by the selection of the wire 47 and the body 46 (core) wrapped by it. On the one hand, the inductance L is to be selected as large as possible to sufficiently reduce the resonance frequency; on the other hand, the structural expenditure is not to become excessively large for this purpose.

For example, the insulated wire 47 consists of rustproof stainless steel and has a diameter of approximately 0.6 mm. One end 48 of the wire is connected to the second end 43 of the grounding band 42. The cylindrical coil body 46 is manufactured from polyether ether ketone (PEEK) and is arranged on a fastening plate 49, which is connectable in a grounding manner to a housing of a vacuum chamber system. Depending on the required inductance for reaching the desired resonance frequency, the coil 45 can have a different number of turns of the steel wire 47 around the PEEK body 46, for example, between 12 and 25 turns.

Alternatively or additionally to the coil 45, other elements which increase the inductance L can also be used, for example, a spring or spiral. This also does not necessarily have to be attached to one end of the grounding band 42, but rather could also be, for example, formed in the middle between two parts of the band 42 or as an integral component of the band 42 (for example spiral band).

Alternatively or additionally to the coil or other elements increasing the inductance L, the correction impedance can contain an electrical resistance R. Such a resistance decreases the quality of the resonant circuit. The resistance is preferably to be sufficiently large that the quality factor Q of the resonant circuit sinks below 1, in particular below 0.5. In particular, at least one of the terminals at the ends 41, 43 of the grounding band 42 can provide an electrical resistance—for example the connecting piece 44. In particular if the resistance is used without coil 45 or equivalent element—i.e., shifting the resonance frequency—of the correction impedance, the electrical resistance R is to be significantly greater than that of the grounding band 42. Depending on the composition of the valve in the grounding band 42—and, if a coil 45 or another element increasing the inductance L is additionally provided, depending on this inductance L—resistances in a range between 0.5 and 1000Ω, in particular in a range between 1 and 100Ω, can be advantageous to sufficiently reduce the quality of the resonant circuit and at the same time not to impair the grounding function.

FIGS. 6*a* and 6*b* show the high-frequency grounding system of FIG. 5 attached to an exemplary embodiment of a vacuum valve of a vacuum chamber system. FIG. 6*a* shows the vacuum valve in an open position O, in which the valve opening 2 is not concealed by the valve cover 4. FIG. 6*b* shows the same vacuum valve in a closed position S, in which the valve plate 4 was moved by means of drive unit 7 and adjustment arm 5 in front of the valve opening 2 and closes it off completely. A first end of the grounding band 42 is fastened laterally on the valve plate 4 here and movable together with it. A second end of the grounding band 42 is fastened together with the coil 45 on a wall 12 of the vacuum chamber system or the valve body, so that grounding of the valve plate 4 takes place. The length of the grounding band is to be selected to be sufficient here in accordance with the mobility of the valve plate 4.

FIGS. 7a and 7b show a further exemplary embodiment of a vacuum chamber system according to the invention having a vacuum valve and a high-frequency grounding device in a cross section. The vacuum chamber system 50 has a process chamber 52, in which low-pressure plasmas can be generated and used for various technical applications. An airlock chamber 51 is connected upstream of this process chamber 52. A first vacuum valve 1 is provided between the airlock chamber 51 and the external atmosphere, which opens or closes the valve opening 2 as needed by means of a valve closure 4 (valve plate).

A second vacuum valve 1' is provided between the airlock chamber 51 and the process chamber 52. This structure enables the pressure within the process chamber 52 to be kept low in an unchanged manner during a long time period.

Both vacuum valves 1, 1' are designed as vacuum transfer valves. A first state is shown in FIG. 7a, in which the first vacuum valve 1 assumes a closed position S and the second vacuum valve 1' assumes an open position O. In FIG. 7b, a second state is shown, in which the first vacuum valve 1 assumes an open position O and the second vacuum valve 1' assumes a closed position S.

In contrast to the embodiment of FIG. 2, the second vacuum valve 1' is designed here having a high-frequency grounding device according to the invention. Alternatively, both the first and also the second vacuum valve 1, 1' can each be designed having a high-frequency grounding device according to the invention.

The second vacuum valve 1' has two valve closures 4, 4', which are arranged on an adjustment arm 5, which is mechanically coupled to a drive unit 7. In the closed position S, valve closure 4' closes the opening of the airlock chamber 51 and valve closure 4 closes the opening of the process chamber 52.

A grounding band 42 of the high-frequency grounding device connects, to ground the vacuum valve 1', that valve closure 4 to an inner wall of the vacuum chamber system 50 which closes the opening to the process chamber 52. On the inner wall, the grounding band 42 is coupled to a coil 45 (as a correction impedance of the grounding device). This arrangement of the high-frequency grounding device approximately corresponds to that shown in FIGS. 6a and 6b, so that the valve plate 4 is largely concealed by the grounding band 42 in this sectional view.

The coil 45 (correction impedance) is designed in such a way that it has a resistance and a reactance, which ensure that a resonance frequency of the parasitic resonant circuit formed by the high-frequency grounding device differs sufficiently from the excitation frequency of the low-pressure plasma.

Since the high-frequency grounding device is located here in the interior of the vacuum chamber system 50, all components are to be suitable for safe use in high vacuum.

It is obvious that these illustrated figures only schematically represent possible exemplary embodiments. The various approaches can also be combined with one another and with devices and methods of the prior art.

The invention claimed is:

1. A high-frequency grounding device for use with a vacuum valve for closing and opening a valve opening of a vacuum chamber system, having a grounding band made of a conductive material for discharging electrical charges occurring on the vacuum valve, wherein the grounding band has a first end and a second end and, for grounding the vacuum valve, is designed to be connected at the first end to a valve closure of the vacuum valve and to be connected at the second end to a component, of the vacuum chamber system, wherein
   the high-frequency grounding device has a correction impedance, wherein
      the grounding band is coupled to the correction impedance so that a resonant circuit results, which comprises the grounding band and the correction impedance, and
      the correction impedance has a first element for shifting a resonance frequency of the resonant circuit.

2. The high-frequency grounding device according to claim 1, wherein the vacuum chamber system has a process chamber, in which a low-pressure plasma can be generated by excitation at an excitation frequency.

3. The high-frequency grounding device according to claim 2, wherein the low-pressure plasma can be generated by shortwave excitation, wherein the excitation frequency of the low-pressure plasma is 13.56 MHz.

4. The high-frequency grounding device according to claim 2, wherein the first element is designed to distance a resonance frequency of the resonant circuit from the excitation frequency of the low-pressure plasma, wherein the resonance frequency is at least 20% less than the excitation frequency.

5. The high-frequency grounding device according to claim 4, wherein the resonant circuit has a resonance frequency which is less than half of the excitation frequency of the low-pressure plasma.

6. The high-frequency grounding device according to claim 2, wherein the vacuum chamber system has an airlock chamber upstream from the process chamber, wherein
   the airlock chamber and an environment of the vacuum chamber system are connected to one another by a first vacuum valve, and
   the process chamber and the airlock chamber are connected to one another by a second vacuum valve.

7. The high-frequency grounding device according to claim 6, wherein the high-frequency grounding device is coupled to the second vacuum valve, wherein the valve opening is an opening between the process chamber and the airlock chamber.

8. The high-frequency grounding device according to claim 1, wherein the correction impedance has at least the first element, wherein the first element for shifting the resonance frequency has an inductance in the range of 1 to 100 μH.

9. The high-frequency grounding device according to claim 8, wherein the first element is designed as a coil, wherein the coil has a body and a metal wire wound around the body, wherein the body is cylindrical.

10. The high-frequency grounding device according to claim 9, wherein the body comprises at least 25% of polyether ether ketone.

11. The high-frequency grounding device according to claim 9, wherein at least one of:
   the coil has between 12 and 25 turns of the metal wire around the body, the metal wire is a steel wire,
the metal wire has a diameter of approximately 0.6 mm, or combinations thereof.

12. The high-frequency grounding device according to claim 1, wherein the grounding band comprises:
a rustproof steel band, having a length between the first end and the second end of at least 50 cm,
wherein the steel band has an electrical resistance of less than 1 Ω.

13. The high-frequency grounding device according to claim 1, wherein the resonant circuit comprises:
the correction impedance, the grounding band, and parts of the vacuum valve.

14. A vacuum valve, for closing and opening a valve opening of a vacuum chamber system, having
a valve seat, which has a valve opening defining an opening axis and a first sealing surface circumferentially around the valve opening,
a valve closure comprising a valve plate, for regulating the volume or mass flow and/or for essentially gas-tight closing of the valve opening using a second sealing surface corresponding to the first sealing surface, and
a grounding device having a grounding band for grounding occurring electrical charges, wherein
the grounding device is designed as a high-frequency grounding device having a correction impedance, wherein
the grounding band is coupled to the correction impedance so that a resonant circuit results, which comprises the grounding band and the correction impedance, and
the correction impedance comprises at least one of the following:
a first element for shifting a resonance frequency of the resonant circuit, a second element for decreasing a quality of the resonant circuit, or combinations thereof.

15. The vacuum valve according to claim 14, having only one high-frequency grounding device having only one grounding band and only one coil as the first element of the correction impedance.

16. The vacuum valve according to claim 14, having a drive unit coupled to the valve closure, which is configured to provide a movement of the valve closure in such a way that the valve closure is adjustable from an open position, in which the valve closure at least partially releases the valve opening, into a closed position, in which a sealing contact of the first sealing surface and the second sealing surface with a sealing material provided in between exists and the valve opening is thus closed gas-tight.

17. The vacuum valve according to claim 4, having a bellows, which is connected to the valve closure and to the valve housing for the atmospheric separation of the drive unit from a process volume, wherein the bellows is designed and arranged in such a way that it is compressed in the open position and it is extended in the closed position.

18. A high-frequency grounding device for use with a vacuum valve for closing and opening a valve opening of a vacuum chamber system, having a grounding band made of a conductive material for discharging electrical charges occurring on the vacuum valve, wherein the grounding band has a first end and a second end and, for grounding the vacuum valve, is designed to be connected at the first end to a valve closure of the vacuum valve and to be connected at the second end to a component, of the vacuum chamber system, wherein
the high-frequency grounding device has a correction impedance, wherein
the grounding band is coupled to the correction impedance so that a resonant circuit results, which comprises the grounding band and the correction impedance, and
the correction impedance has a second element for decreasing a quality of the resonant circuit.

19. The high-frequency grounding device according to claim 18, wherein the second element has an electrical resistance to decrease the quality of the resonant circuit, which is at in a range between 1 and 100 Ω.

20. The high-frequency grounding device according to claim 19, wherein the second element is designed in such a way that a quality factor of the resonant circuit is less than 0.5.

* * * * *